United States Patent [19]

Kapany et al.

[11] 4,143,233
[45] Mar. 6, 1979

[54] SOLAR ENERGY COLLECTOR

[75] Inventors: Narinder S. Kapany, Woodside, Calif.; Edgar E. Hardy, Kettering; Thomas A. Orofino, Centerville, both of Ohio

[73] Assignee: Monsanto Research Corporation, St. Louis, Mo.

[21] Appl. No.: 803,494

[22] Filed: Jun. 6, 1977

[51] Int. Cl.$^2$ ............................................. H01L 31/04
[52] U.S. Cl. .............................. 136/89 PC; 126/270; 126/271
[58] Field of Search .................. 136/89 PC; 126/270, 126/271

[56] References Cited

U.S. PATENT DOCUMENTS

| 3,134,906 | 5/1964 | Henker | 136/89 PC |
| 3,923,381 | 12/1975 | Winston | 350/293 |
| 3,936,157 | 2/1976 | Kapany | 350/258 |
| 3,976,508 | 8/1976 | Mlausky | 136/89 |
| 4,024,852 | 5/1977 | L'Esperance et al. | 136/89 PC |
| 4,029,519 | 6/1977 | Schertz et al. | 136/89 PC |
| 4,045,246 | 8/1977 | Mlausky et al. | 136/89 PC |
| 4,052,228 | 10/1977 | Russell | 136/89 PC |

OTHER PUBLICATIONS

N. B. Goodman et al., Solid-Dielectric Compound Parabolic Concentrators Applied Optics, vol. 15, No. 10, Oct. 1976, pp. 2434-2436.

Primary Examiner—John H. Mack
Assistant Examiner—William Leader
Attorney, Agent, or Firm—L. Bruce Stevens

[57] ABSTRACT

A solar energy collector is described which consists of either a photoelectric cell or a heat-absorbing material mounted within a hollow concentrator. The photoelectric cell has the form of a rod of a monocrystalline element or compound with a generally cylindrical junction spaced at a distance radially inwardly from the outer surface of the rod. The photoelectric cell is mounted within a hollow transparent trough shaped concentrator or body which contains a liquid, e.g. water, which can be made to flow in order to both cool the photoelectric cell, thereby improving its efficiency, and to promote transmission of solar energy to the photoelectric cell by total internal reflectance. The heat absorbing material can be a metal pipe through which liquid can be made to flow to remove heat absorbed by the pipe, and preferably the pipe will be coated black on the outside surface to promote the absorption of heat into the pipe, and/or the liquid in the hollow transparent trough-shaped body can be made to flow over heat absorbing material to recover heat energy.

11 Claims, 6 Drawing Figures

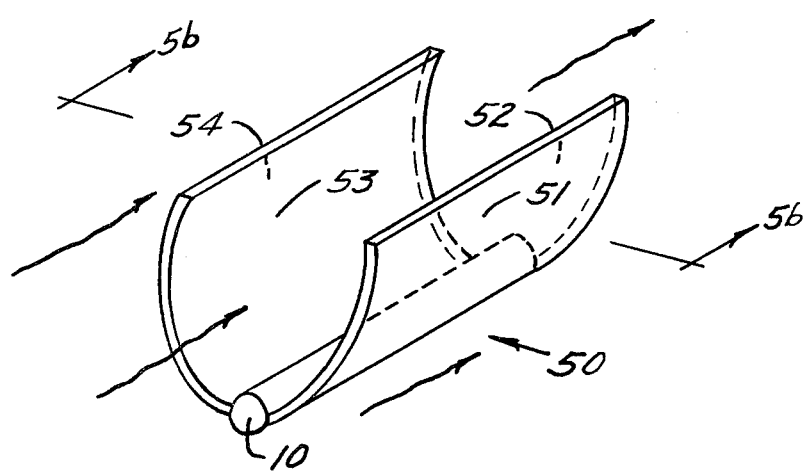
Fig-5-a
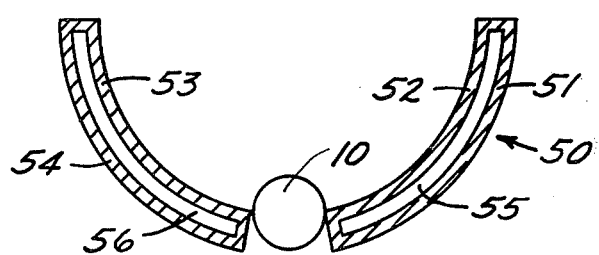
Fig-5-b

SOLAR ENERGY COLLECTOR

BACKGROUND OF THE INVENTION

This invention relates to solar energy collectors which can use photoelectric cells or heat-absorbing materials to receive energy. More particularly, it relates to a transparent hollow trough-shaped body containing a liquid in the trough of the body to increase the acceptance angle of solar energy and to promote total internal reflectance, together with means to remove energy from the collector.

Photoelectric cells are used for transforming radiation energy into electrical energy. The incident photons are absorbed in the semiconductor where they produce minority charge carriers, either holes or electrons, which diffuse to a charge separating junction, typically near the illuminated surface of the photoelectric cell, and make possible a delivery of electricity by the cell.

Generally, photoelectric cells consist of semiconductor wafers of various shapes. These semiconductor wafers are reduced to a desired final thickness by sawing, etching, and lapping with an accompanying loss of typically about one-half of the semiconductor material. However, the thickness of conventional semiconductor wafers cannot be reduced without limit because the photoelectric cell response will be reduced and, because the semiconductor materials are very brittle, the wafers break easily during manufacture and use unless proper thermal and physical conditions are maintained.

The photoelectric cell or heat energy absorbing material can be used with a solar energy concentrator to increase the amount of solar radiation reaching the surface of the cell, or heat absorbing material, thereby increasing effectiveness and energy output. Many types and shapes of concentrators, such as flat and curved mirrors, dished reflectors, fresnel lenses, and various trough shaped reflectors, have been used to concentrate sunlight upon a photoelectric cell or heat energy absorbing material. However, the problems inherent in efficient utilization of solar energy and the required intricate and costly apparatus for tracking the sun in its apparent daily and seasonal motion through the heavens have not been adequately resolved by these devices.

SUMMARY OF THE INVENTION

A solar energy collector is described which consists of either a photoelectric cell or a heat-absorbing material mounted within a hollow concentrator. The photoelectric cell has the form of a rod of a monocrystalline element or compound with a generally cylindrical junction spaced at a distance radially inwardly from the outer surface of the rod. The photoelectric cell is mounted within a hollow transparent trough shaped concentrator or body which contains a liquid, e.g. water, which can be made to flow in order to both cool the photoelectric cell and promote total internal reflectance, thereby improving the performance of the photoelectric cell. The heat absorbing material can be a metal pipe through which liquid can be made to flow to remove heat absorbed by the pipe, and preferably the pipe will be coated black on the outside surface to promote the absorption of heat into the pipe, and/or the liquid in the hollow transparent trough-shaped body can be made to flow over heat absorbing material to recover heat energy.

Briefly, there is provided a photoelectric cell in the form of a rod of a semiconducting monocrystalline element or compound. The rod has a body of cylindrical form of a first electrical conductivity type and a surface layer of a second electrical conductivity type surrounding at least a portion of the body to form a junction of generally cylindrical form between the body and the surface layer. A first electrode is secured to the body and a second electrode is secured to the surface layer, the electrodes being insulated from one another.

Both conventional photoelectric cells and the rod-shaped photoelectric cell of this invention can use a collector to increase the amount of sunlight reaching the surface of the cell, thereby increasing the effectiveness of the cell and its electrical output. Configurations of collectors which are particularly well suited for use with this invention are those in the shape of a trough, for example a trough in the form of a non-imaging curved collector or of a straight-sided vee-shaped collector. By employing a hollow dielectric of suitable shape containing water, total internal reflectance can be used to increase the concentration of solar energy reaching the photoelectric cell or to increase the angle of acceptance of the incident energy into the collector, and by flowing the water through the collector the photoelectric cell is cooled improving the efficiency of the photoelectric cell.

Alternative to the photoelectric cell, a heat energy absorbing material can be used and provision can be made to recover the heat from said material. One suitable means is a pipe with liquid flowing through the pipe to extract heat absorbed by the pipe, and it would be preferred that the pipe be coated black for maximum heat absorption. Alternatively, the liquid in the trough-shaped body can be made to flow through the trough-shaped body over the heat energy absorbing material, e.g. a black body surface material positioned in the same area as the photoelectric cell, to extract heat from the material.

Open trough or dish concentrators have two general weaknesses: their angular acceptance angle, for acceptance of incident radiation, is limited and a substantial light loss, typically 20%, is caused by imperfect metal reflections within the trough. The filling of the concentrator with water or other liquid, helps to solve the aforementioned problems. The incident light is refracted at the entrance end of the collector, thereby substantially increasing the acceptance angle of the system. If, additionally, the collector is of the total-internal reflectance type, the light impinges on the side surfaces which are surrounded by low refractive index media, air for example, and suffers total internal reflection in the water thereby eliminating the light losses encountered on metallic reflection.

BRIEF DESCRIPTION OF THE DRAWINGS

FIG. 5(a) shows a perspective view of a photoelectric cell in combination with a hollow collector.

FIG. 5(b is a cross-sectional view of FIG. 5(a) to show a collector having double-walled sides of transparent material with an air space between the walls plus a photoelectric cell.

In FIG's 3, 4, 5(a) and 5(b) the photoelectric cell 10 can be replaced by a pipe through which a liquid flows to extract absorbed heat energy, or other heat energy absorbing material can be used instead of either the photoelectric cell or the pipe.

DESCRIPTION OF THE PREFERRED EMBODIMENT

Figure 1:
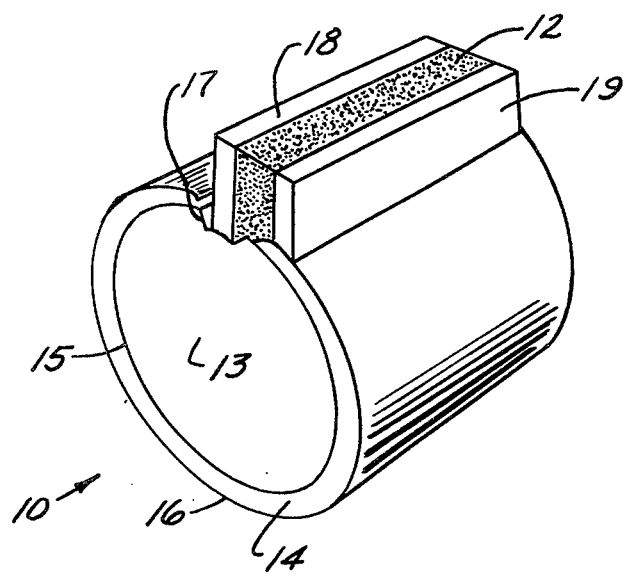
FIG. 1 is a drawing showing the rod shaped photoelectric cell.

Attention is now directed to the annexed drawings wherein like numbers denote like or corresponding parts throughout the several views; in which:

The photoelectric cell, generally numbered 10, of this invention is shown in FIG. 1 in its normal configuration as a generally cylindrical rod of a monocrystalline semiconductor material generally having a diameter of between 1 and 10 millimeters. A body 13 has a generally cylindrical form comprised of a material having a first electrical conductivity type. A surface layer 14 of a material having a second electrical conductivity type surrounds the body 13 such that a junction 15, having a generally cylindrical shape, is formed between the body 13 and the surface layer 14 and a surface 16 is formed on the exterior diameter of the photoelectric cell 10. An example of a photoelectric cell 10 having this configuration is comprised of a rod with a body 13 of p-type silicon and a surface layer 14 of a n-type silicon such that a p-n junction 15 of generally cylindrical form is produced. The junction 15 is typically located between 0.1 and 0.4 microns beneath the surface 16. Electrical photons of incident radiation are absorbed in the semiconductor material and produce minority carriers, holes or electrons, which diffuse to the charge separating junction.

For use of the photoelectric cell 10 electrical contact is required with both the body 13 and the surface layer 14. When the surface layer 14 completely surrounds the body 13, as shown in FIG. 1, a groove 17 is formed along a portion of the length of the photoelectric cell 10 to provide a location for electrical contact with the body 13. The groove 17 is between 0.4 and 3.0 millimeters in width at the surface 16 of the photoelectric cell 10 and at least 0.4 microns in depth to penetrate the junction 15. The shape of the groove 17 may vary, but the groove will typically be in the shape of a rectangle, a 'U', or a 'vee'. A first electrode 18, a metallic strip, is secured within the groove 17 to provide electrical and thermal contact with the body 13. The second electrode 19, a metallic strip similar to the first electrode 18, is secured to the surface 16 of the photoelectric cell 10, adjacent to and parallel the first electrode 18 but separated therefrom by an insulating layer 12, to provide electrical contact with the surface layer 14.

Figure 2:
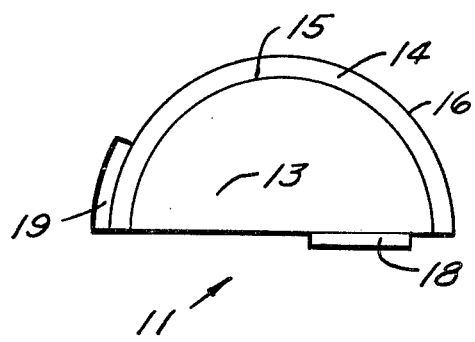
FIG. 2 is a drawing showing a typical arcuate section of the photoelectric cell.

FIG. 2 shows a modification of the photoelectric cell 10 wherein an arcuate section 11 of the cell is used. On the arcuate section 11 the surface layer 14 and junction 15 surround only the portion of the body 13 that will be exposed to incident radiation. As with the cylindrical photoelectric cell 10, a first electrode 18 is attached to the body 13 and a second electrode 19 is attached to the surface layer 14 in such a manner that incident radiation continues to strike a major portion of the surface layer 14.

The effectiveness of the photoelectric cell is enhanced by the use of a collector or concentrator to increase the flux of solar energy onto the surface of the cell. Typical collectors having trough-shaped configurations are shown in FIGS. 3 and 4.

Figure 3:
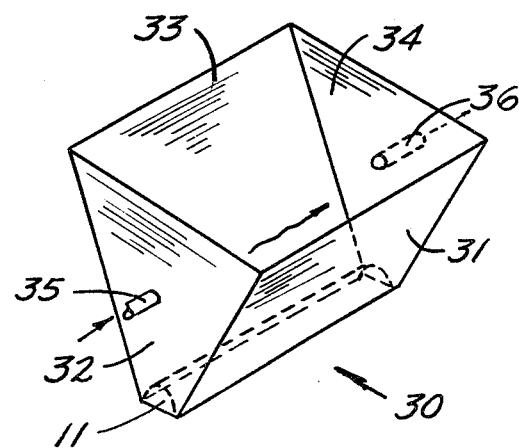

FIG. 3 shows a truncated vee-shaped hollow collector 30 closed at the bottom by arcuate-shaped cell 11 as shown in FIG. 2, having transparent plastic, such as but not limited to polystyrene or methyl methacrylate, or glass sides 31 and 33 and ends 32 and 34 which can be plastic or glass, transparent or not, or metal. Inlet 35 and exit pipe 36 provide a means to flow water through the container, water flow being indicated by the unnumbered arrows, and water is added to the collector at such a rate that it does not overflow; thus, an air interface is provided on the outside of the collector as well as on the water surface causing light to be reflected back into the collector and onto cell 11 improving the efficiency of the collector by total internal reflection as will be discussed in more detail below. Electrodes 18 and 19 as indicated in the discussion of FIG. 2 must be electrically insulated from each other as well as any electrical connections (not shown) to these electrodes. The water serves to both cool cell 11 improving its efficiency and to enhance the total internal reflection. Furthermore, the water from collector 30 can be sent to a heat exchanger (not shown) to recover sensible heat to improve the efficiency of a total solar energy system. Cell 10 could be used instead of cell 11 with proper electrical insulation.

Figure 4:
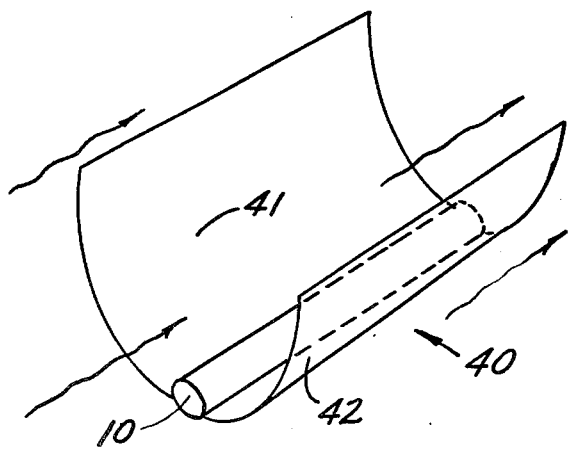
FIGS. 3 and 4 show the photoelectric cell with typical forms of hollow collectors.

FIG. 4 shows collector 40 having the form of a hollow trough with inwardly curved sides 41 and 42, and the inner surface of these sides are highly polished metal to reflect light striking these inner surfaces back into the collector. This collector 40 is shown positioned submerged in flowing water indicated by the arrows bearing no numbers which as in the case of FIG. 3 serves to cool cell 10, and recover sensible heat from the water. As in FIG. 3 electrodes 18 and 19 of cell 10 must be electrically insulated from each other. Cell 10 would be positioned upside down as compared to positioning in FIG. 1 with the electrodes extending out the bottom of the collector and being insulated electrically from each other. Substantially pure, low conductivity water is preferred for use in all embodiments and it may also be necessary to seal electrically as by plastic encapsulation the entire top portion of cell 10 including electrodes 18 and 19 and groove 17. Insulated electrical connections can be provided through the plastic capsule to the electrodes. Cell 11 could be used instead of cell 10 with proper electrical insulation.

FIGS. 5(a) and 5(b) show another embodiment of the invention substantially equivalent in performance to FIG. 4. FIG. 5(b) is a cross-sectional view of the collector of FIG. 5(a). FIG. 5a shows collector 50 similar in shape to collector 40 and with cell 10 positioned at the bottom of the collector. Like FIG. 4 the collector 50 is shown submerged in flowing water as indicated by the unnumbered arrows. Unlike collector 40 collector 50 has transparent inner wall 52 and 53 joined at the top, bottom and ends to transparent outer walls 51 and 54, respectively, with air spaces 55 and 56, respectively, promote reflection of light back into collector 50 enhancing total internal reflection.

The invention was tested in the laboratory by making a hollow trough shaped parabolic collector of acrylic sheet having a silicon solar cell attached along the outside bottom of the trough using a silicone adhesive. Different output loads were coupled to solar-cell and provision was made to measure the output voltage of the solar cell. First the hollow collector was irradiated empty through the open top with a fluorescent light and voltage measurements were taken with different loads on the solar cell. Then the hollow collector was filled with water and again irradiated through the top and water. The output voltages for the water filled were about 2 times as high as for the empty collector at the same output load on the solar cell after suitable loads had been determined, i.e. the concentration ratio is about 2.

The acceptance angle of all of these collectors is increased by filling the forms with a transparent dielectric material such as water with refractive index $N_2$ greater than that of air, $N_1 = 1$. Further gains in collector efficiency are obtained, subject to the limitations noted below, when the polished metal surface as in collector 40 is removed entirely. Metallic reflection, typically 80% to 90% complete, is thus replaced by total internal reflection at the dielectric to air interface which is nearly 100% complete.

The special characteristics of the reflection of light at an air/dielectric interface must be taken into account to realize the advantages of total internal reflection for sunlight concentrators. Light propagating within an optically dense medium of refractive index $N_2$ is totally reflected at an interface with air of refractive index $N_1$ only when the sine of the angle of incidence as normally defined is greater than the ratio $N_1/N_2$. Thus there are two necessary conditions for total internal reflection of a specific light ray: the ray must be directed from the dielectric of higher refractive index toward the air, and not vice versa; and the ray must be sufficiently oblique to the surface to satisfy the mathematical relationship above.

For a trough containing water to perform effectively as a sunlight concentrator for photoelectric cells, it is necessary that light be injected into the water at the front surface, reflected at suitably shaped sidewalls, and ejected from the transparent dielectric into the cell. Injection of light rays into dielectrics occurs with higher efficiency for the smaller angles of incidence. Thus it is advantageous that the front surface of the collector be approximately normal to the direction of the sun. These losses can be reduced by application of an anti-reflective coating to the front surface which can serve the further purpose of reducing loss of water by evaporation.

The general performance characteristics of both metallic and total internal reflecting sunlight concentrators are determined by the shape and texture of the sidewalls. In the case of total internal reflectance, however, rays which are insufficiently oblique to the walls are only partially reflected and energy is lost from the concentrator by the portion of the rays passing through. This can be avoided by designing the wall shape so that this situation seldom arises or by metallizing certain zones of the wall where partial internal reflection is likely to occur.

The use of liquid dielectric sunlight concentrators poses special problems in transferring the radiant energy flux from the dielectric to the photoelectric cell. Should air, or any medium having an index of refraction less than that of the collector dielectric, partially or wholly fill the spacing between the refractive collector dielectric and the photoelectric cell, then, instead of refracting and transmitting the light to the surface of the photoelectric cell, the surface of the collector dielectric which is adjacent the photoelectric cell may become an additional reflecting surface similar to the sides of the collector and a substantial portion of the light which enters the collector may be reflected away from the photoelectric cell rather than transmitted to it, thus greatly reducing the efficiency of the collector.

It may be quickly seen that the refraction of solar radiation at the entrance to the collector by the material within a mirrored surface type collector increases the angle of acceptance of the collector when compared to an identical collector without any filling material; thus sunlight is accepted for a longer period of time and in greater quantities without adjusting the position of the collector. Likewise, if an acceptance angle is specified, the collector may be made smaller than the conventional unfilled collector.

A liquid-filled collector also has advantages over a solid plastic total internal reflectance (TIR) collector because it may be lighter, it is cheaper and it provides cooling.

Furthermore, if one uses a liquid having an n greater than the n of the plastic of a transparent hollow trough-shaped body to fill the body, total internal reflectance is possible from the inner surface of the plastic trough rather than the outer surface; and, for a mirrored surface type collector filling with a liquid having an n greater than water increases the acceptance angle as compared to water filling.

For additional concentration of the solar radiation two collectors may be attached such that the second collector is connected to the bottom of the first collector.

As various changes could be made in the construction herein described without departing from the scope of the invention, it is intended that all matter contained in the above description shall be interpreted as illustrative and not in a limiting sense. For example, although water would usually be preferred because of its cheapness and good heat transfer properties, an organic liquid, preferably having better dielectric properties than water, such as nonane, ethylene glycol, a silicone fluid, etc. could be used.

What is claimed is:

1. A solar energy collector comprising a transparent hollow trough-shaped body having a closed bottom, an open top, sides which are shaped so said body is wider at the top than at the bottom and two ends, containing a liquid in the trough of said body to increase the acceptance angle of solar energy into said collector and promote total internal reflectance, the outside of said body being in contact with a material of lower refractive index sufficient to cause solar energy to be reflected back into said body, and means to remove energy from said collector.

2. A solar energy collector of claim 1 having an elongated photoelectric cell positioned in and along the bottom of said body, said body having an index of refraction between that of air and the material of said photoelectric cell, and means for causing said liquid to flow through said body to cool said photoelectric cell improving the efficiency thereof and promoting transmission of solar energy to said photoelectric cell by total internal reflectance.

3. A solar energy collector of claim 2 wherein said photoelectric cell comprises a rod of a semiconducting monocrystalline element or compound of elements, said photoelectric cell having a shape in the form of at least an arcuate section of a cylinder, a p-n junction adapted to receive solar radiation spaced at a distance radially inwardly from the outer surface of said arcuate section and extending within at least a portion of said arcuate section coaxial with the outer surface and forming a surface layer on said arcuate section, a first electrode secured to said arcuate section and a second electrode secured to a portion of said surface layer, such that incident solar radiation strikes said surface layer, said first and second electrodes being insulated from one another.

4. A solar energy collector of claim 1 wherein said body has generally straight sides.

5. A solar energy collector of claim 1 wherein said body has curved sides.

6. A solar energy collector of claim 1 wherein said body is open at each end, and said collector is positioned in a flowing stream of water whereby said liquid flows through said body to remove heat therefrom.

7. A solar energy collector of claim 1 wherein said body is closed at each end except for an inlet and outlet whereby said liquid can be flowed through said body.

8. A solar energy collector of claim 1 wherein said liquid comprises water.

9. A solar energy collector of claim 1 wherein a heat energy absorbing material is positioned in and along the bottom of said body.

10. A solar energy collector of claim 9 wherein said heat energy absorbing material is a metal pipe with means to transmit a fluid through said pipe to remove heat energy therefrom.

11. A solar energy collector of claim 1 wherein said liquid has a refractive index greater than that of the material of the trough-shaped body, thereby promoting total internal reflection from the inner surface of said body.

* * * * *